(12) United States Patent
Krueger (10) Patent No.: US 7,441,179 B2
(45) Date of Patent: Oct. 21, 2008

(54) DETERMINING A CHECKSUM FROM PACKET DATA

(75) Inventor: Jon Krueger, San Diego, CA (US)

(73) Assignee: Intel Corporation, Santa Clara, CA (US)

( * ) Notice: Subject to any disclaimer, the term of this patent is extended or adjusted under 35 U.S.C. 154(b) by 974 days.

(21) Appl. No.: 10/692,585

(22) Filed: Oct. 23, 2003

(65) Prior Publication Data

US 2005/0089031 A1  Apr. 28, 2005

(51) Int. Cl.
*H03M 13/09* (2006.01)
(52) U.S. Cl. ..................................... 714/807
(58) Field of Classification Search ................ 714/807
See application file for complete search history.

(56) References Cited

U.S. PATENT DOCUMENTS

| | | | | |
|---|---|---|---|---|
| 5,541,920 A | * | 7/1996 | Angle et al. | 370/429 |
| 5,935,268 A | * | 8/1999 | Weaver | 714/758 |
| 6,269,374 B1 | * | 7/2001 | Chen et al. | 707/100 |
| 6,557,044 B1 | * | 4/2003 | Cain et al. | 709/242 |
| 6,571,291 B1 | * | 5/2003 | Chow | 709/230 |
| 6,601,216 B1 | | 7/2003 | Obata | |
| 6,629,141 B2 | * | 9/2003 | Elzur et al. | 370/392 |
| 6,643,821 B2 | * | 11/2003 | Karim et al. | 714/801 |
| 6,728,930 B2 | * | 4/2004 | Poeluev | 714/807 |
| 6,802,038 B1 | * | 10/2004 | Yu | 714/758 |
| 6,886,103 B1 | * | 4/2005 | Brustoloni et al. | 726/15 |
| 6,944,168 B2 | * | 9/2005 | Paatela et al. | 370/401 |
| 6,957,346 B1 | * | 10/2005 | Kivinen et al. | 713/153 |
| 7,079,537 B1 | * | 7/2006 | Kanuri et al. | 370/392 |
| 7,096,399 B2 | * | 8/2006 | Pieczul | 714/748 |
| 7,103,821 B2 | * | 9/2006 | Lakshmanamurthy et al. | 714/758 |
| 7,185,153 B2 | * | 2/2007 | Chandra et al. | 711/155 |
| 7,191,433 B2 | * | 3/2007 | Narad et al. | 717/140 |
| 7,239,635 B2 | * | 7/2007 | Ozguner | 370/392 |
| 7,260,650 B1 | * | 8/2007 | Lueckenhoff | 709/246 |
| 7,266,120 B2 | * | 9/2007 | Cheng et al. | 370/390 |
| 2003/0076794 A1 | | 4/2003 | Kawasaki et al. | |
| 2003/0169737 A1 | * | 9/2003 | Lavigne et al. | 370/392 |

FOREIGN PATENT DOCUMENTS

EP   0 366 589 A2   5/1990
EP   0 366 589 A3   5/1990

OTHER PUBLICATIONS

International Search Report, International App. No. PCT/US2004/034601, Applicant Ref. No. P17966PCT, Completion Date: Feb. 24, 2005, Date Mailed: Mar. 2, 2005, pp. 4.
PCT/US2004.034601 Int'l Preliminary Report on Patentability dated May 4, 2006.

* cited by examiner

*Primary Examiner*—Stephen M Baker
(74) *Attorney, Agent, or Firm*—Robert A. Greenberg (57) ABSTRACT

In general, in one aspect, the disclosure describes a method of determining a checksum. The method includes accessing a checksum of the at least the portion of a packet and adjusting the checksum based on a subset of the at least the portion of the packet before and after modification of the subset.

24 Claims, 13 Drawing Sheets

DETERMINING A CHECKSUM FROM PACKET DATA

BACKGROUND

Networks enable computers and other devices to communicate. For example, networks can carry data representing video, audio, e-mail, and so forth. Typically, data sent across a network is divided into smaller messages known as packets. By analogy, a packet is much like an envelope you drop in a mailbox. A packet typically includes "payload" and a "header". The packet's "payload" is analogous to the letter inside the envelope. The packet's "header" is much like the information written on the envelope itself. The header can include information to help network devices handle the packet appropriately. For example, the header can include an address that identifies the packet's destination. A given packet may "hop" across many different intermediate network devices (e.g., "routers"; "bridges" and "switches") before reaching its destination.

A number of network protocols cooperate to handle the complexity of network communication. For example, a protocol known as Transmission Control Protocol (TCP) provides "connection" services that enable remote applications to communicate. That is, much like picking up a telephone and assuming the phone company will make everything in-between work, TCP provides applications on different computers with simple commands for establishing a connection (e.g., CONNECT and CLOSE) and transferring data (e.g., SEND and RECEIVE). Behind the scenes, TCP transparently handles a variety of communication issues such as data retransmission, adapting to network traffic congestion, and so forth.

To provide these services, TCP operates on packets known as segments. Generally, a TCP segment travels across a network within ("encapsulated" by) a larger packet such as an Internet Protocol (IP) datagram. The payload of a segment carries a portion of a stream of data sent across a network. A receiver can reassemble the original stream of data from the received segments.

Potentially, segments may not arrive at their destination in their proper order, if at all. For example, different segments may travel very different paths across a network. Thus, TCP assigns a sequence number to each data byte transmitted. This enables a receiver to reassemble the bytes in the correct order. Additionally, since every byte is sequenced, each byte can be acknowledged to confirm successful transmission.

Occasionally, data transmission errors may occur. For example, due to signal noise, a "1" bit within a segment may be accidentally changed to a "0" or vice-versa. To enable detection of errors, the TCP header includes a "checksum" field. The value of the checksum is computed by storing zeroes in the segment's checksum field and then summing each byte in the segment using an arithmetic operation known as "one's complement addition".

DETAILED DESCRIPTION

Figure 1A:
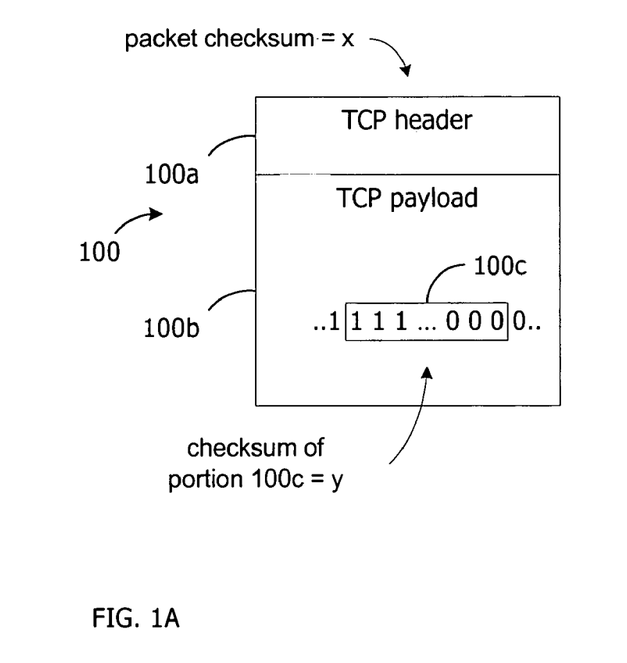
FIGS. 1A and 1B illustrate operations that update a checksum.

FIG. 1A depicts a Transmission Control Protocol (TCP) segment's 100 header 100a and payload 100b. As shown, a checksum for the segment has some value "x". Potentially, after determination of the checksum, some piece 100c of the payload 100b and/or header 100a may be altered. For example, the piece 100c may include data of a Universal Resource Locator (URL) that is to be changed to redirect a request for a web-page to a different server. Once changed, the previously computed segment 100 checksum, "x", would no longer reflect the current segment contents. Leaving the checksum unaltered may cause a receiver to incorrectly conclude that the segment suffered transmission errors and may respond by dropping ("throwing-away") the segment. To avoid this scenario, the checksum may be recomputed after segment modification. For example, all the bytes of the segment 100 may again be retrieved from memory and summed. Retrieving the entire segment from memory and recomputing the checksum, can consume considerable computing resources.

Figure 1B:
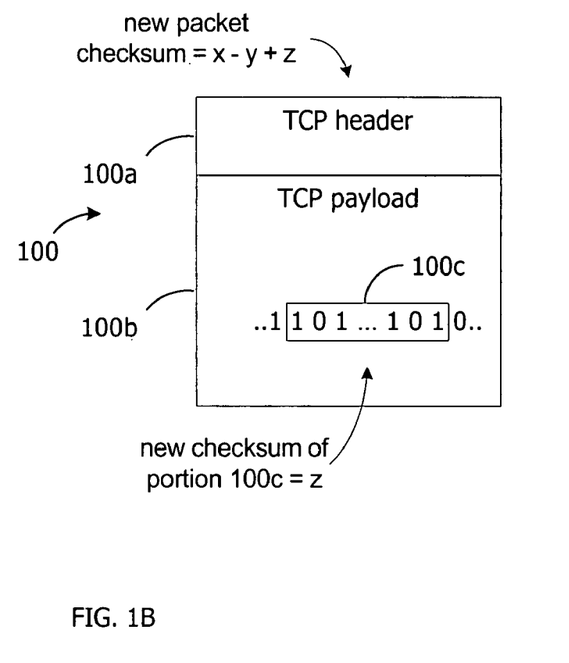

FIG. 1B illustrates an approach that incrementally updates a checksum based on the changes to a subset of the packet. That is, instead of recomputing the checksum anew from scratch, a checksum may be adjusted based on the checksum change caused by a modification. As an example, the contents of portion 100c changed from "111 . . . 000" in FIG. 1A, to "101 . . . 101" in FIG. 1B. As shown in FIG. 1B, the checksum value can be updated based on the change of the checksum of the portion 100c before and after the modification. For example, as shown in FIG. 1A, before modification, the checksum for the bytes of region 100c had a value of "y". As shown in FIG. 1B, after modification, a checksum value for the bytes of the region 100c has a value of "z". Thus, as shown, the overall segment checksum may be updated by subtracting the old segment checksum, "x", by the value of the checksum of the region 100c before modification, "y", and adding the checksum of the region 100c after modification "z". This, or similar arithmetic operations, can significantly reduce memory operations used to retrieve an entire segment from memory, freeing memory bandwidth for other uses.

Figure 2:
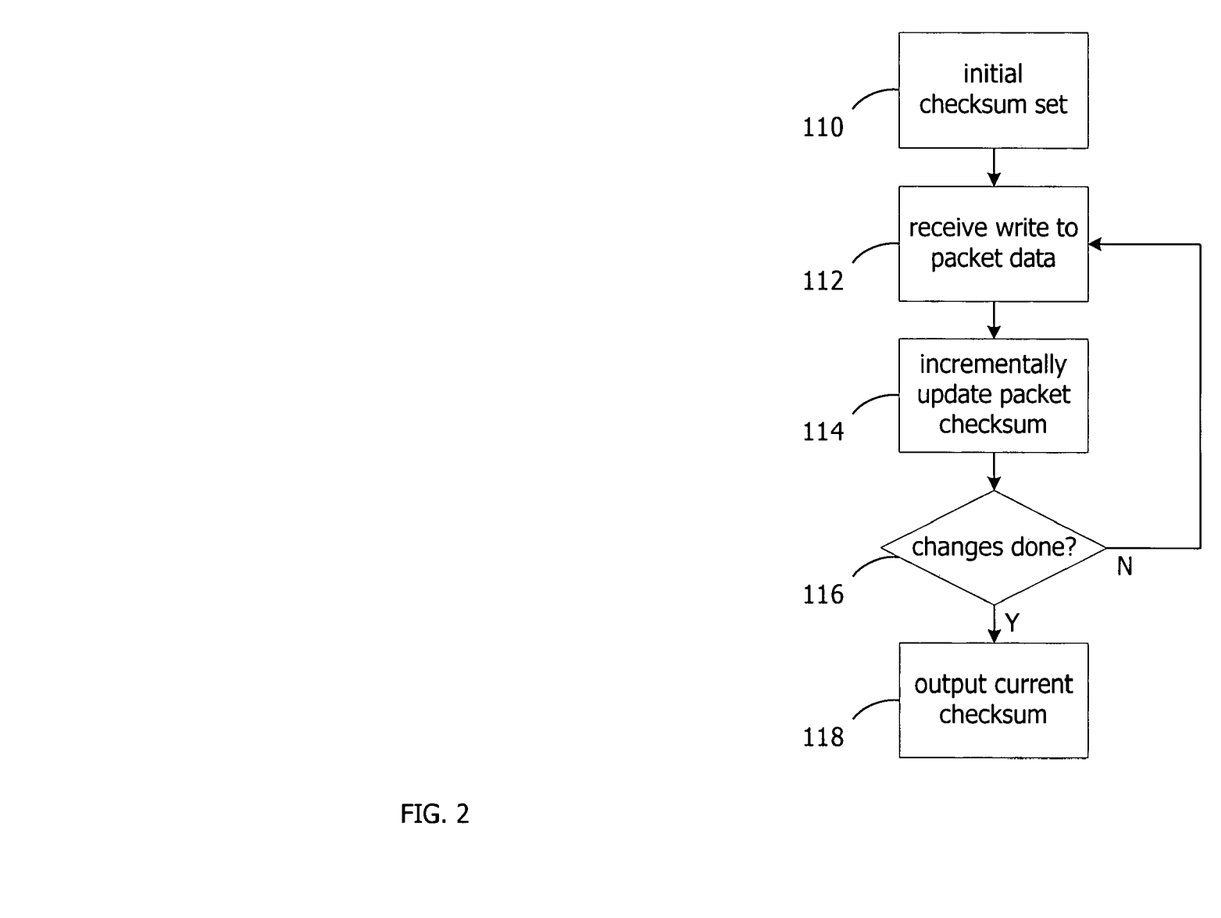
FIG. 2 is a flow-chart of operations updating a checksum.

Potentially, a segment may be modified multiple times. FIG. 2 illustrates a flow-chart of a process that updates the checksum for each of a series of modifications. As shown, the process accesses the initial checksum value for the segment, for example, by accessing 110 the value in the segment's header or by independently computing the checksum. After modification(s) 112 to some piece of the segment, the checksum can be incrementally updated 114 using the approach illustrated in FIGS. 1A and 1B. This process 116 can repeat as different portions of the segment are modified. After the modifications 116, the updated checksum can be output 118, for example, for inclusion within the segment header prior to transmission.

A wide variety of similar approaches may be implemented. For example, instead of updating after each modification, an "adjustment value" may be accumulated based a series of packet modification and used to change the checksum only once.

Figure 3A:
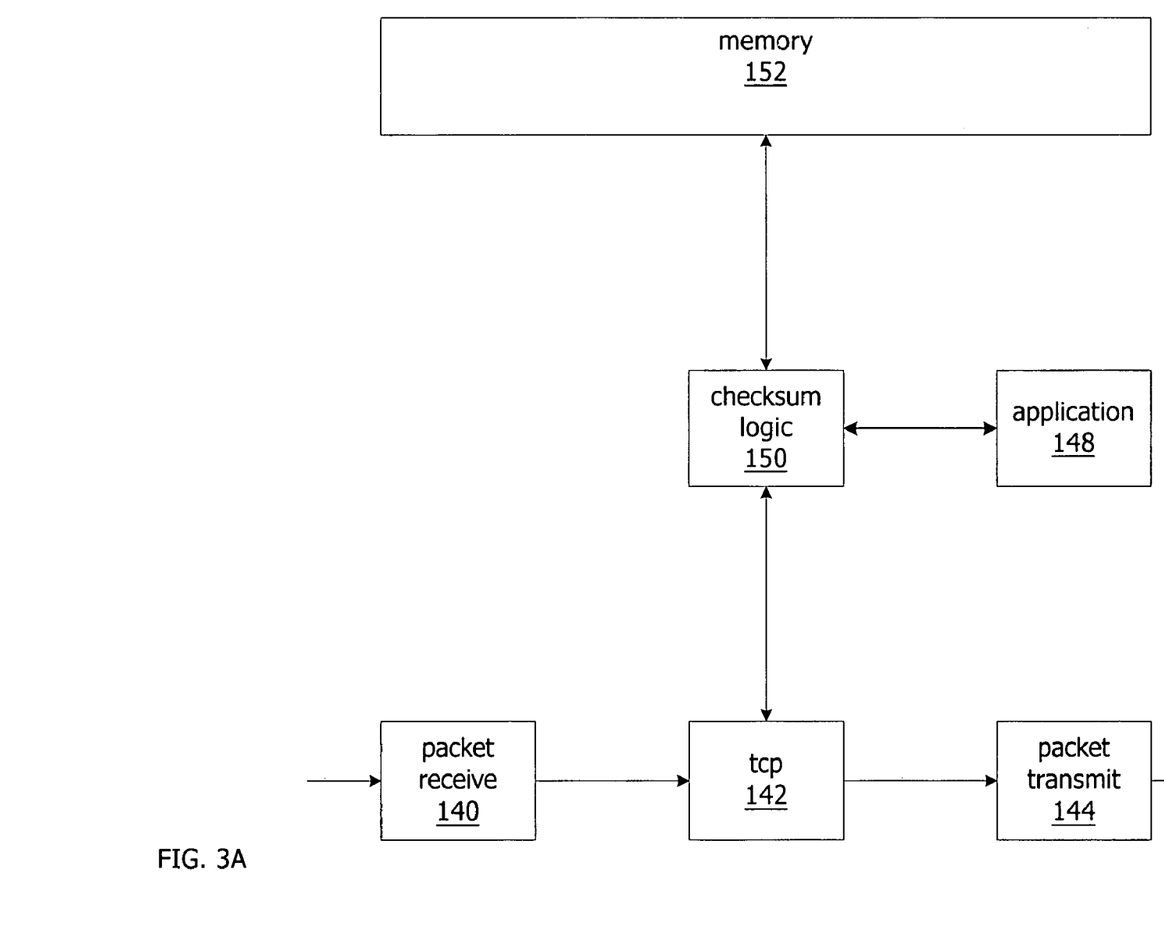
FIGS. 3A-3F illustrate-operation of a scheme that updates a checksum.

Techniques described above may be used in a wide variety of implementations. For example, FIG. 3A illustrates a system that includes logic to process segments. The logic may be implemented in a variety of hardware and/or software. For example, the logic may be implemented as threads of program instructions.

In a thread-based implementation shown, the logic includes a packet receive thread 140 that performs initial operations on packets such as accumulating and storing the packets 140 in memory 152 as they arrive. A TCP thread 142 performs TCP operations on the segments such as maintaining a connection's TCP state, performing packet segmentation/reassembly, tracking sequence numbers sent/received/expected/acknowledged, and so forth (see Request for Comments (RFC) 793, 1122, and 1323).

The TCP thread 142 may notify an application thread 148 of a received segment. The application (e.g., an application operating at Layer 4 or greater with respect to the TCP/IP or Open Source Institute (OSI) protocol stack models) may perform a variety of operations on the segment payload including parsing and modifying data included in the packet payload. Examples of such applications include URL redirection, extensible Markup Language (XML) transaction monitoring, persistent HyperText Transfer Protocol (HTTP) cookie load balancing, and so forth.

As shown, the application 148 can invoke a variety of procedures 150 (e.g., instructions of methods, functions, macros, subroutines, etc.) that can automatically handle checksum update operations for the application 148. These operations include operations that track application reads and writes to the segment and incrementally update the checksum accordingly. FIGS. 3B-3F illustrate sample operation of this scheme in greater detail.

Figure 3B:
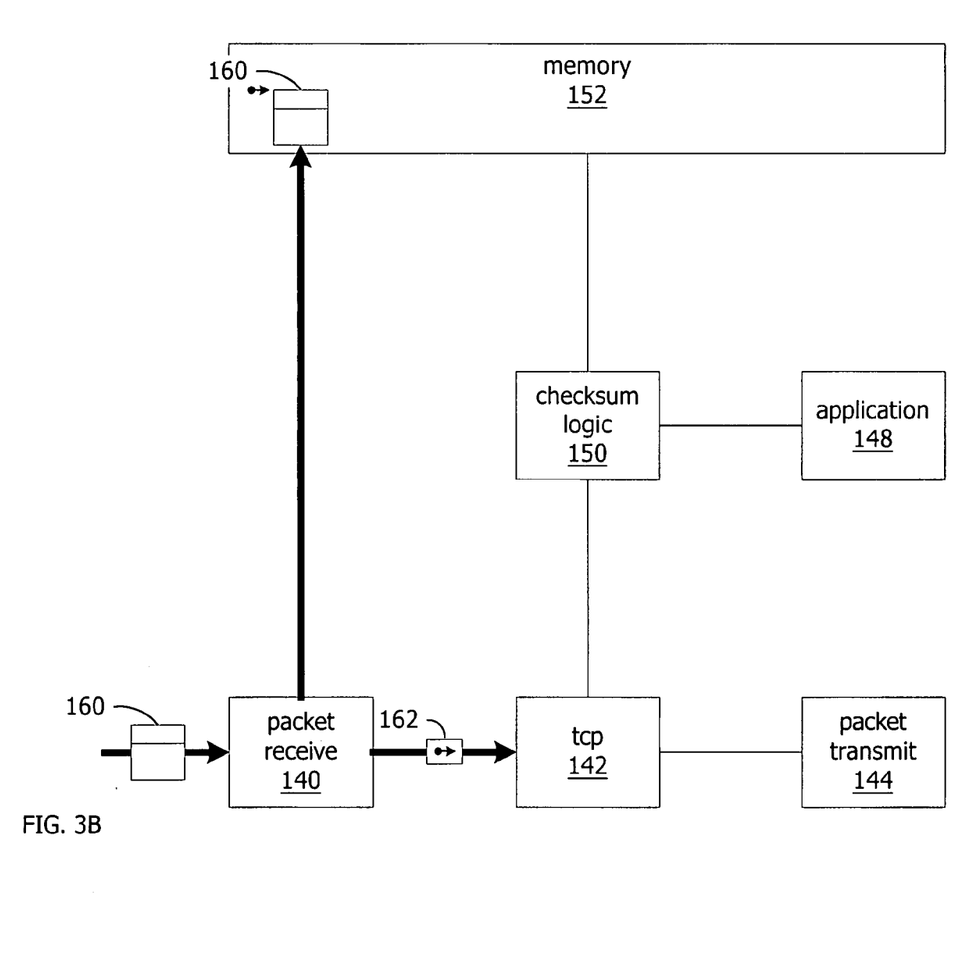

As shown in FIG. 3B, packet receive thread 140 receives a packet 160. The thread 140 may accumulate the packet as it arrives piecemeal from lower level components (e.g., a media access control (MAC) device). The thread 140 may also perform de-encapsulation, for example, to extract a TCP segment from within a greater packet (e.g., an Internet Protocol (IP) packet, Ethernet frame, or collection of Asynchronous Transfer Mode (ATM) packets). The thread 140 stores the packet 160 in memory 152 and creates a "descriptor" 162 for the stored packet 160 that identifies the location of the packet 160 within memory 152, the length of the packet, and/or other information. The descriptor 162 enables the different threads to access the packet without the computational expense and complexity of physically copying the packet 160 for the different threads to work on. For example, as shown, the receive thread 140 passes the descriptor 162 to the TCP thread 142.

Figure 3C:
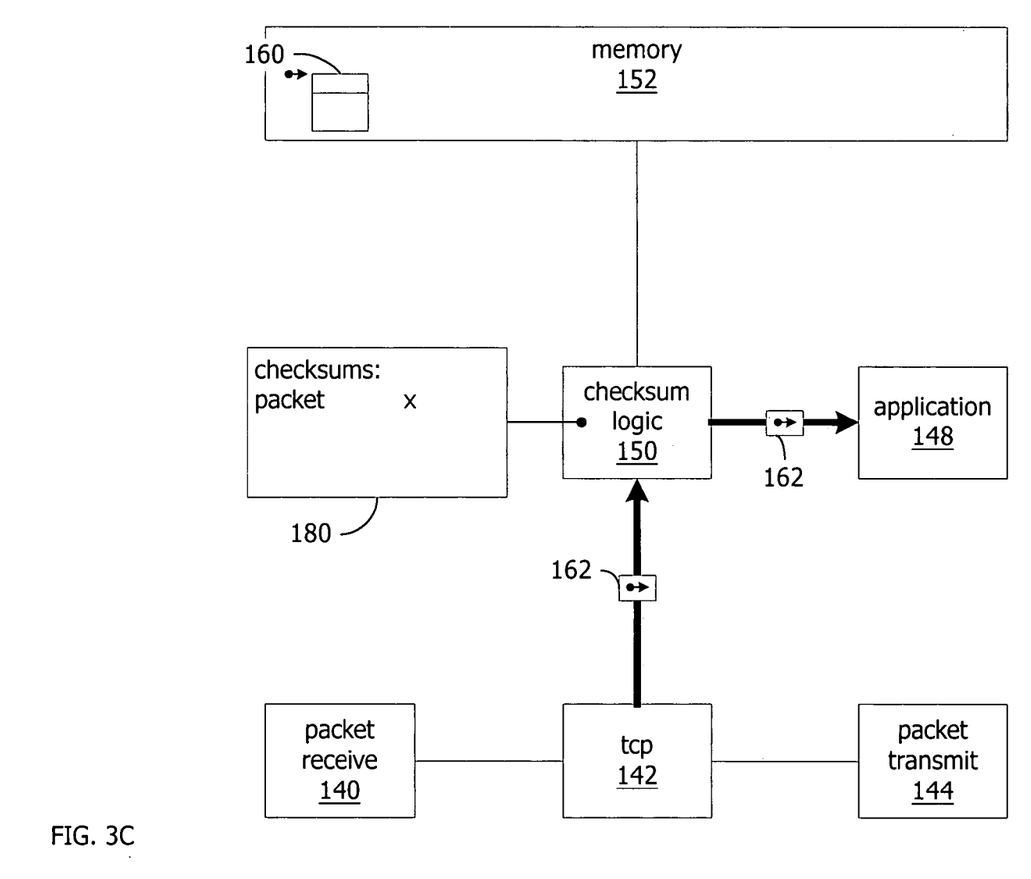

As shown in FIG. 3C, the TCP thread 142 notifies the application 148 of the segment 160 via a routine provided by checksum logic 150. The logic 150 provides operations that initialize data structures used to incrementally update, the segment's checksum. For example, the operations can access the segment's current checksum from memory and initialize data 180 used to track modifications to the segment and correspondingly update the segment's checksum.

Figure 3D:
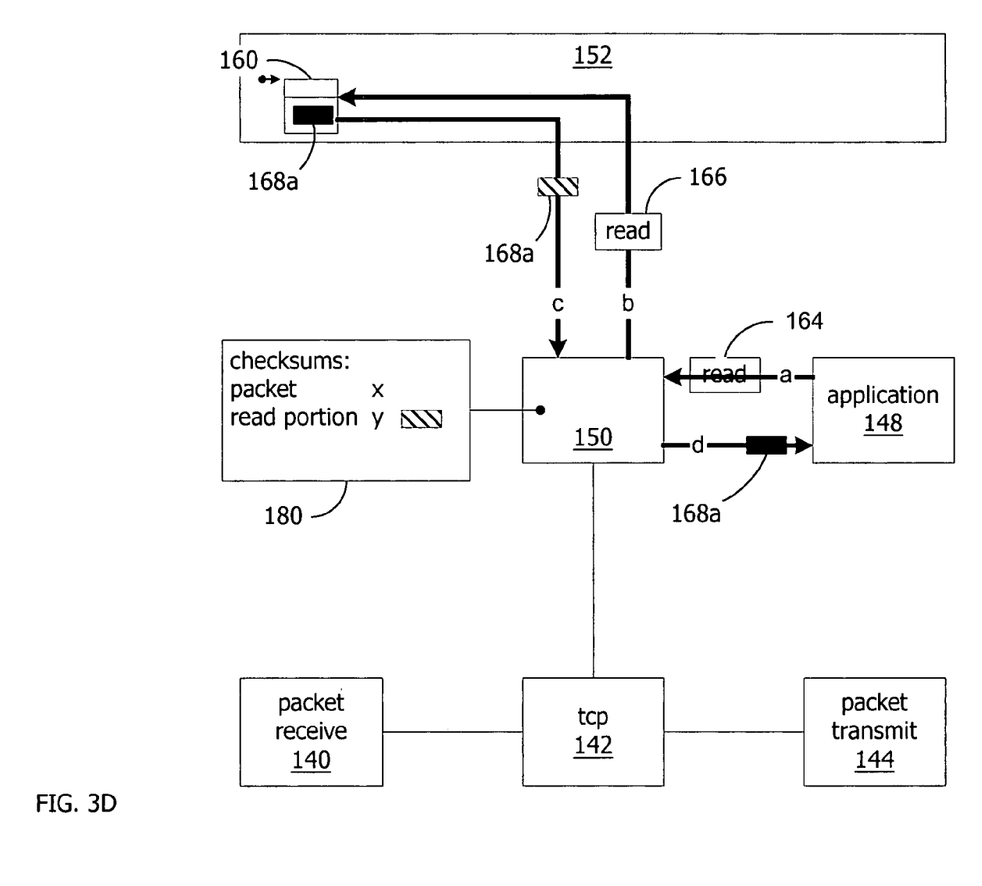

As shown in FIG. 3D, the application 148 issues a read request 164 for some portion 168a of the packet 160. Instead of directing this request directly to memory 152, the application 148 can issue a read request 164 to a routine provided by the checksum logic 150. The logic 150 issues a memory read 166 on the application's behalf, but also starts monitoring the data 168a retrieved for changes made by the application 148.

Figure 3E:
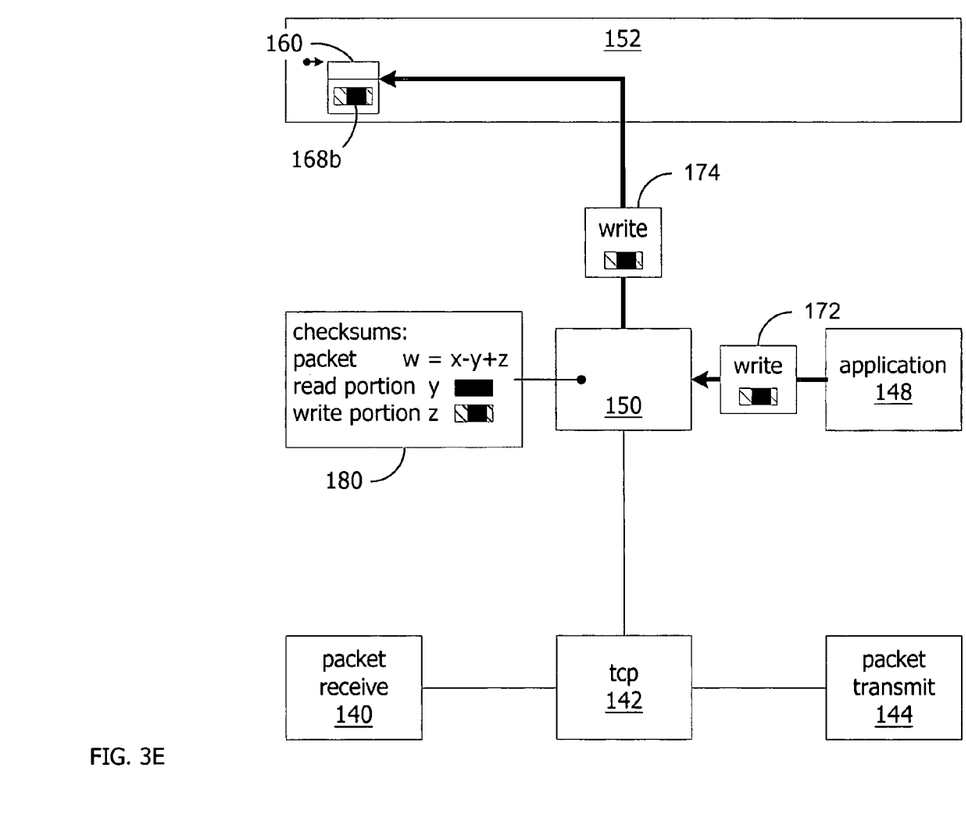

As shown in FIG. 3E the application 148 may determine some change (e.g., a URL substitution) to make to the retrieved segment data 168a. FIG. 3E illustrates the change to portion 168a as a solid block within segment portion 168b. Again, instead of directly accessing memory, the application uses a write operation 172 provided by the logic 150. The logic 150 can not only issue a memory 152 write 174 for the application, but also can incrementally update the segment's checksum. For example, as shown, the interface 150 may update the segment checksum to value "w" based on a determination of a checksum of the segment piece before 168a, "y", and after 168b, "z", modification.

Figure 3F:
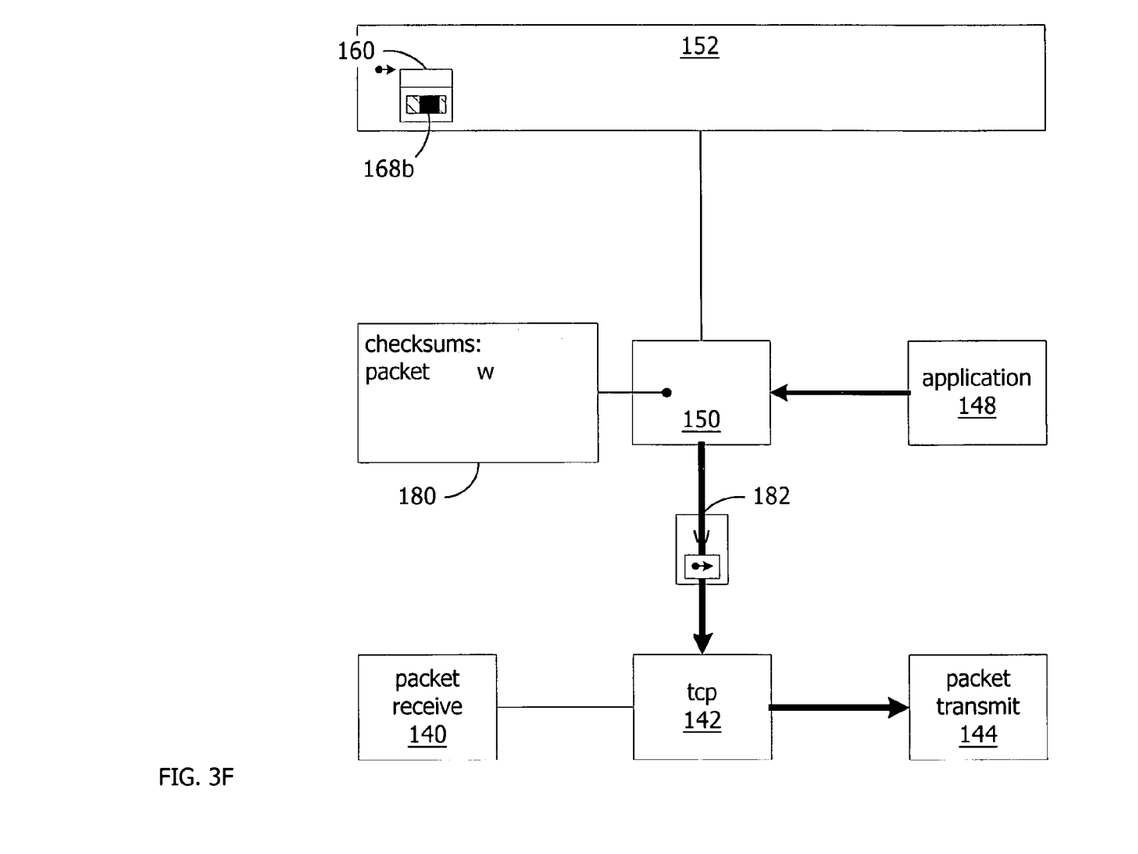

Eventually, as shown in FIG. 3F, the application 148 will complete its processing of the segment and notify the TCP thread 142 that the segment can be transmitted (e.g., to a host processor or framing device). As shown, the application 148 can invoke a logic 150 routine that delivers the updated checksum to the TCP thread 142. The TCP thread 142, in turn, may modify the segment to include the checksum or may pass the determined checksum to a packet transmit thread 144 that handles transmit operations. Due to the incremental checksum update, the packet can be transmitted without the delay of a new checksum computation.

Figure 4:
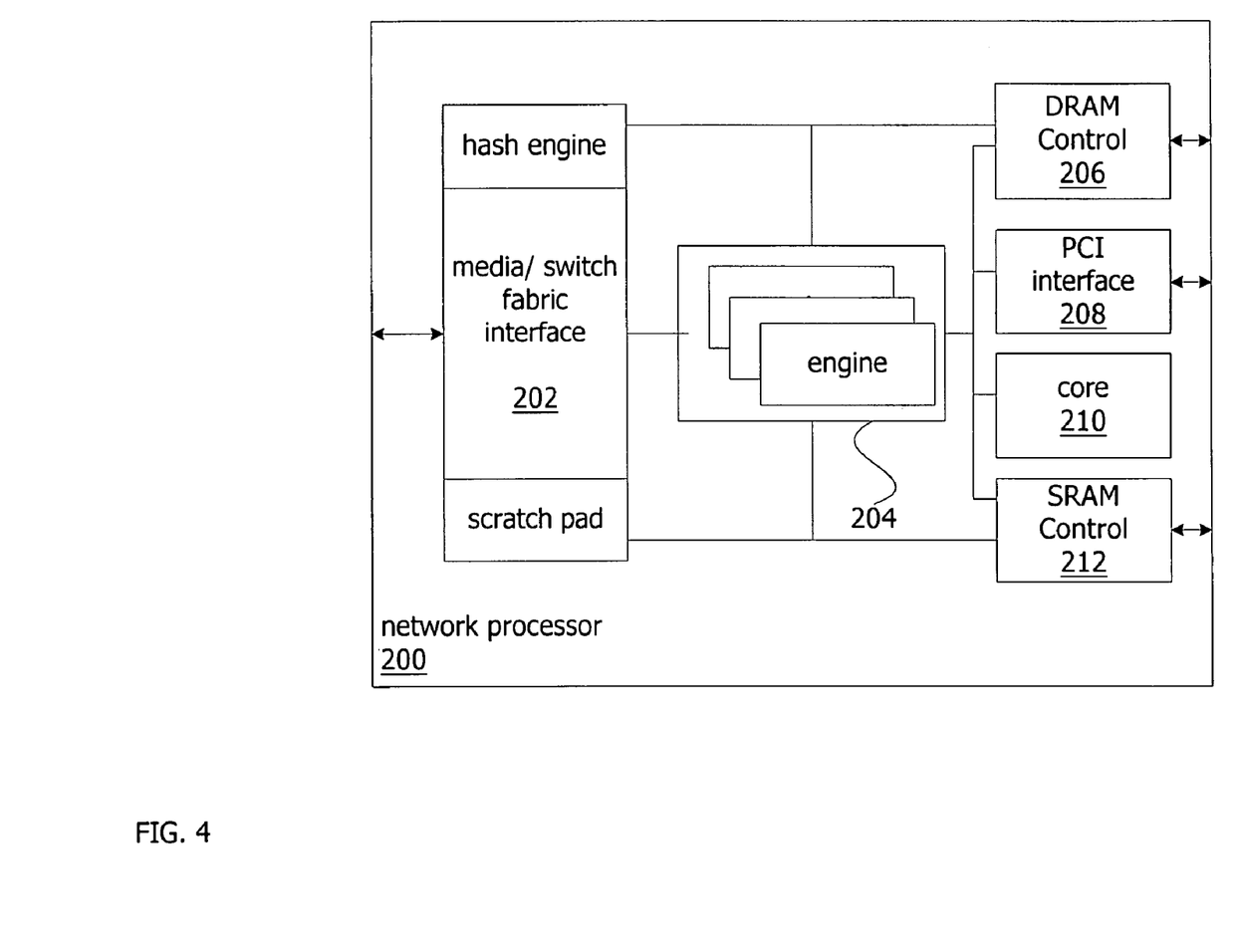
FIG. 4 is a diagram of a network processor.

Again, the checksum techniques may be implemented in a variety of ways on a variety of platforms. For example, FIG. 4 depicts an example of network processor 200 that can implement techniques described above. The network processor 200 shown is an Intel® Internet eXchange network Processor (IXP). Other network processors feature different designs.

The network processor 200 shown features a collection of packet processing engines 204 integrated on a single die. The engines 204 shown each offer multiple threads of execution to process packets. As shown, the processor 200 also includes a core processor 210 (e.g., a StrongARM® XScale®) that is often programmed to perform "control plane" tasks involved in network operations. The core processor 210, however, may also handle "data plane" tasks and may provide additional packet processing threads.

As shown, the network processor 200 includes interfaces 202 that can carry packets between the processor 200 and other network components. For example, the processor 200 can feature a switch fabric interface 202 (e.g., a Common Switch Exchange (CSIX) interface) that enables the processor 200 to transmit a packet to other processor(s) or circuitry connected to the fabric. The processor 200 can also include an interface 202 (e.g., a System Packet Interface (SPI) interface) that enables to the processor 200 to communicate with physical layer (PHY) and/or link layer devices. The processor 200 also includes an interface 208 (e.g., a Peripheral Component Interconnect (PCI) bus interface) to communicate, for example, with a host. As shown, the processor 200 also includes other components shared by the engines such as memory controllers 206, 212, a hash engine, and scratch pad memory.

The packet processing techniques described above may be implemented on a network processor, such as the network processor shown, in a wide variety of ways. For example, the threads described in FIGS. 3A-3F may be implemented as engine 204 threads. Potentially, the engines 204 may provide multiple instances of the same type of thread on a given engine. For example, one engine may provide n (e.g., 8) packet receive threads 140 while a different engine provides n TCP threads 142. The multiple threads enable the network processor 200 to simultaneously process multiple segments in parallel.

Figure 5:
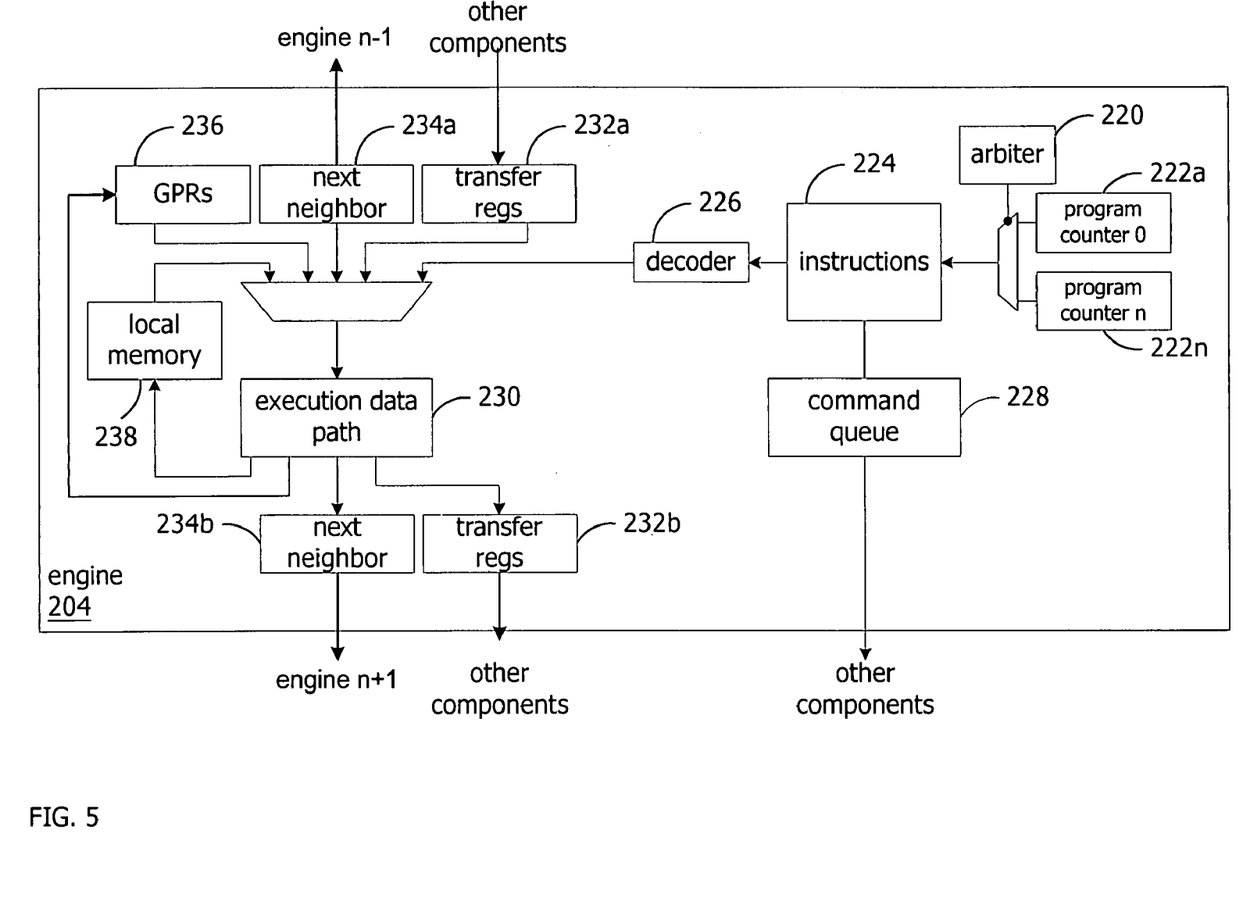
FIG. 5 is a diagram of an engine of a network processor.

The incremental update operations provided can improve performance of a network processor 200. For example, the technique(s) can save engine computation cycles and reduce the memory bandwidth consumed in updating a checksum FIG. 5 illustrates the architecture of a sample network processor 200 engine 204 in greater detail. The engine 204 may feature a Reduced Instruction Set Computing (RISC) instruction set tailored for packet processing. For example, the engine 204 instruction set may not include floating point instructions or instructions for integer division commonly provided by general purpose processors.

As shown, the engine 204 includes a variety of local storage elements. For example, the engine 204 includes local memory 238, general purpose registers 236, and "next neighbor" registers 234 that enable the engine 204 to communicate directly with neighboring engines 204. The engine 204 also includes transfer registers 232 that buffer data sent to 232a or received from 232a other network processor 200 components such as the shared SRAM 212 or DRAM 206 controllers. The transfer registers 232 may be divided into two different sets of registers, e.g., one set for SRAM and one set for DRAM data.

The sample engine 204 shown provides multiple threads of execution. To support the multiple threads, the engine 204 includes program counters 222 for each thread. A thread arbiter 220 selects the program counter for a thread to execute. This program counter is fed to an instruction store 224 that outputs the instruction identified by the program counter to an instruction decode 226 unit. The instruction decode 226 unit may feed the instruction to an execution unit (e.g., an Arithmetic Logic Unit (ALU) and associated content addressable memory (CAM)) 230 for processing or may initiate a request to another network processor 200 component (e.g., a memory controller) via command queue 228.

Different implementations of checksum techniques described above may take advantage of the engine 204 architecture. For example, when a portion of segment data is retrieved from memory (e.g., FIG. 3D), the portion is delivered to the engine 204 via transfer registers 232a. By caching the retrieved portion in the transfer registers 232 (or in some other engine-local storage) and mapping subsequent writes to the cached data, the engine 204 can quickly determine the checksum values of a segment portion before and after modification.

Figure 6:
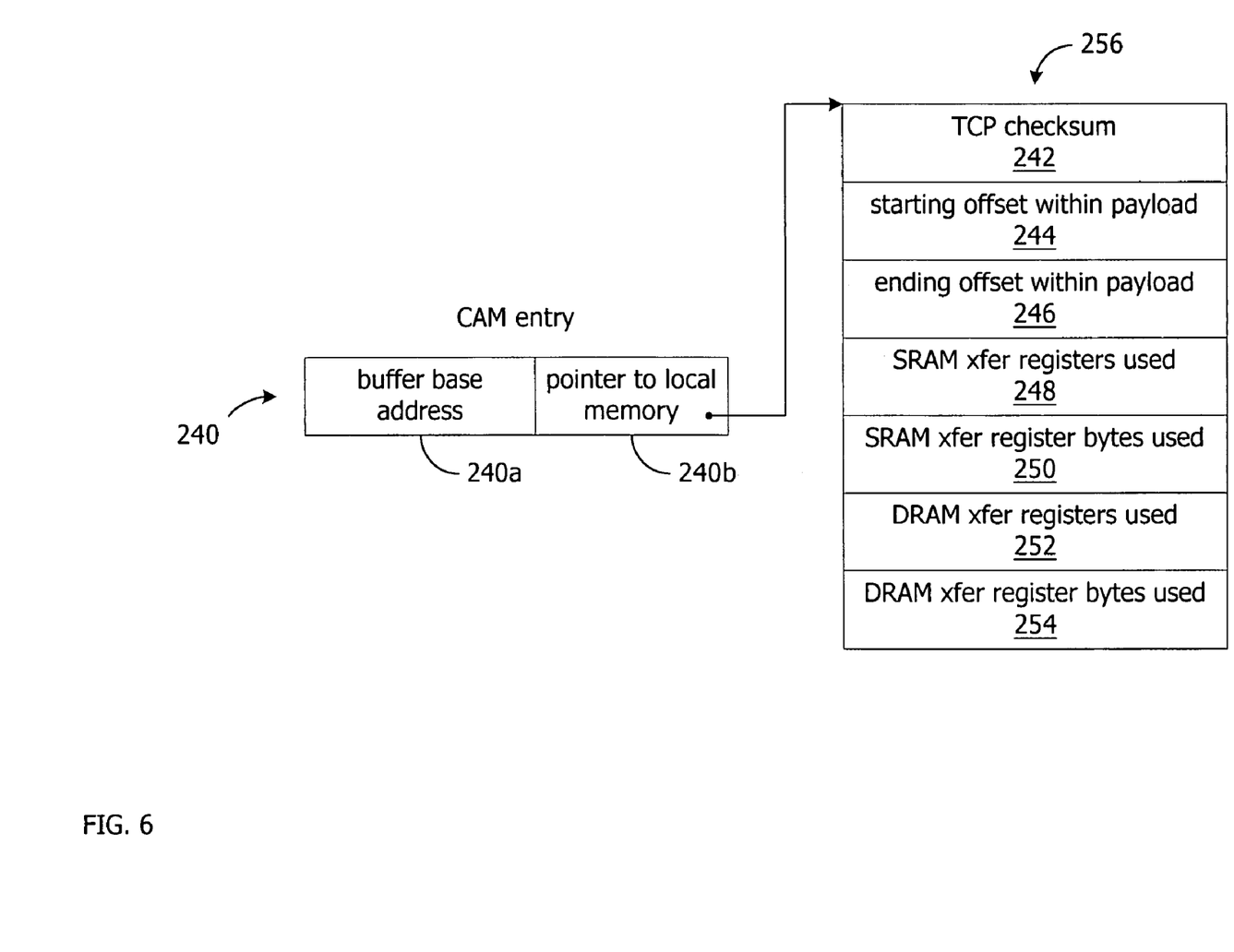
FIG. 6 is a diagram of data structures used in a scheme to update a checksum.

FIG. 6 illustrates an example of data structures that may be used in such a scheme. The data structures shown include a CAM entry 240 for a segment being processed. The CAM may include other entries corresponding to other segments being processed. The CAM entry 240 enables quick lookup of checksum update data associated with a given segment.

In greater detail, the CAM entry 240 shown stores the base address 240a of the packet 160 in memory (e.g., 152 in FIGS. 3A-3F) or some other packet identifier. The entry 240 shown also includes a reference (e.g., a pointer) 240b to data 256 in memory (e.g., local memory 238) storing information about the segment. A read (e.g., 164 in FIG. 3D) or write (e.g., 172 in FIG. 3E) operation may specify the base address of the packet. This address can be used to search the CAM entries and access the data 256 associated with a packet having that base address.

The data 256 associated with a given segment can include the segment's current checksum value 242. The data 256 may also store data that maps a portion of the packet 160 to its cached location within the transfer registers 232a (or other memory). For example, as shown, the data 256 may identify the starting 244 and ending 246 offset of a given portion relative to the start of a segment's payload. The data 256 may also include data to map the portion of the payload identified by the offsets 244, 246 to local storage. For instance, the data may identify the number 248, 252 of transfer registers storing the cached segment portion and the respective number of bytes 250, 254 within the registers used.

As an example, bytes 10 through 20 of a segment's payload may be read from memory and stored in 4-byte portions of two adjacent SRAM transfer registers followed by a 3-byte portion of a third transfer register. Thus, the starting offset 244 would have a value of 10 and the ending offset 246 would have a value of 20. The SRAM transfer registers used 248 would have a value of 3 and the number of SRAM transfer register bytes used 250 would have a value of 11. A write to byte-12 of the payload would fall within the starting 244 (10) and ending 246 (20) offsets. The transfer register data 248-250 can then be used to map the payload-relative byte number to a location within the transfer registers. That is, byte-12 of the payload would map to byte-3 in the first transfer register since byte-1 in the first transfer register is mapped to byte-10 of the payload. An incremental checksum update could be computed after the write.

Figure 7:
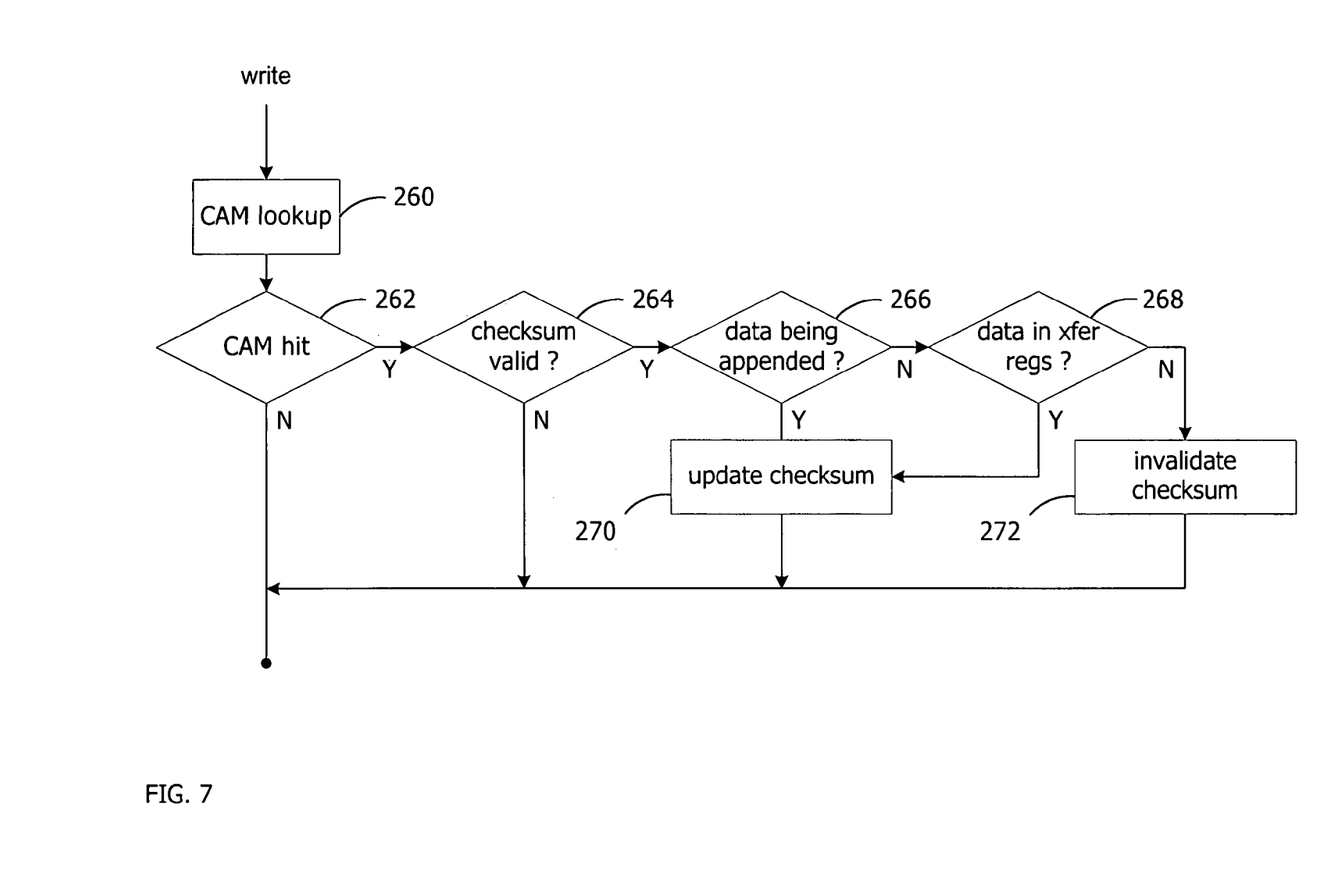
FIG. 7 is a flow-chart of operations that update a checksum using the data structures of FIG. 6.

FIG. 7 illustrates a flow-chart of an example of a checksum update process using the data structures of FIG. 6. As shown, the process receives a write operation to a segment. The write operation can include a segment identifier (e.g., the base address found in a segment's describer). The process uses the identifier to lookup 260 (e.g., a CAM lookup) the checksum data associated with a segment. If a lookup entry is found 262, the process can incrementally update 270 the checksum for data being appended 266 to the segment and/or for data currently cached 268 in the transfer registers by a previous read.

Potentially, an incremental update of the checksum may not be possible in a given implementation. For example, an implementation may rely on an application to read payload data before writing to that piece of a segment. If this constraint is not honored by the application, the data being altered may not be in transfer registers 268. In such a case, the checksum may be invalidated 272 (e.g., by writing zero to the overall checksum value). Once invalidated, subsequent writes need not trigger 264 incremental checksum adjustment. Other implementations, however, may automatically read a given piece of the payload when a write "outside" the currently cached data occurs.

The technique(s) described above may be implemented in a variety of devices. For example, the checksum logic may be incorporated within a TCP Offload Engine ("TOE") that at least partially alleviates the burden of TCP related operations on host processor(s).

Figure 8:
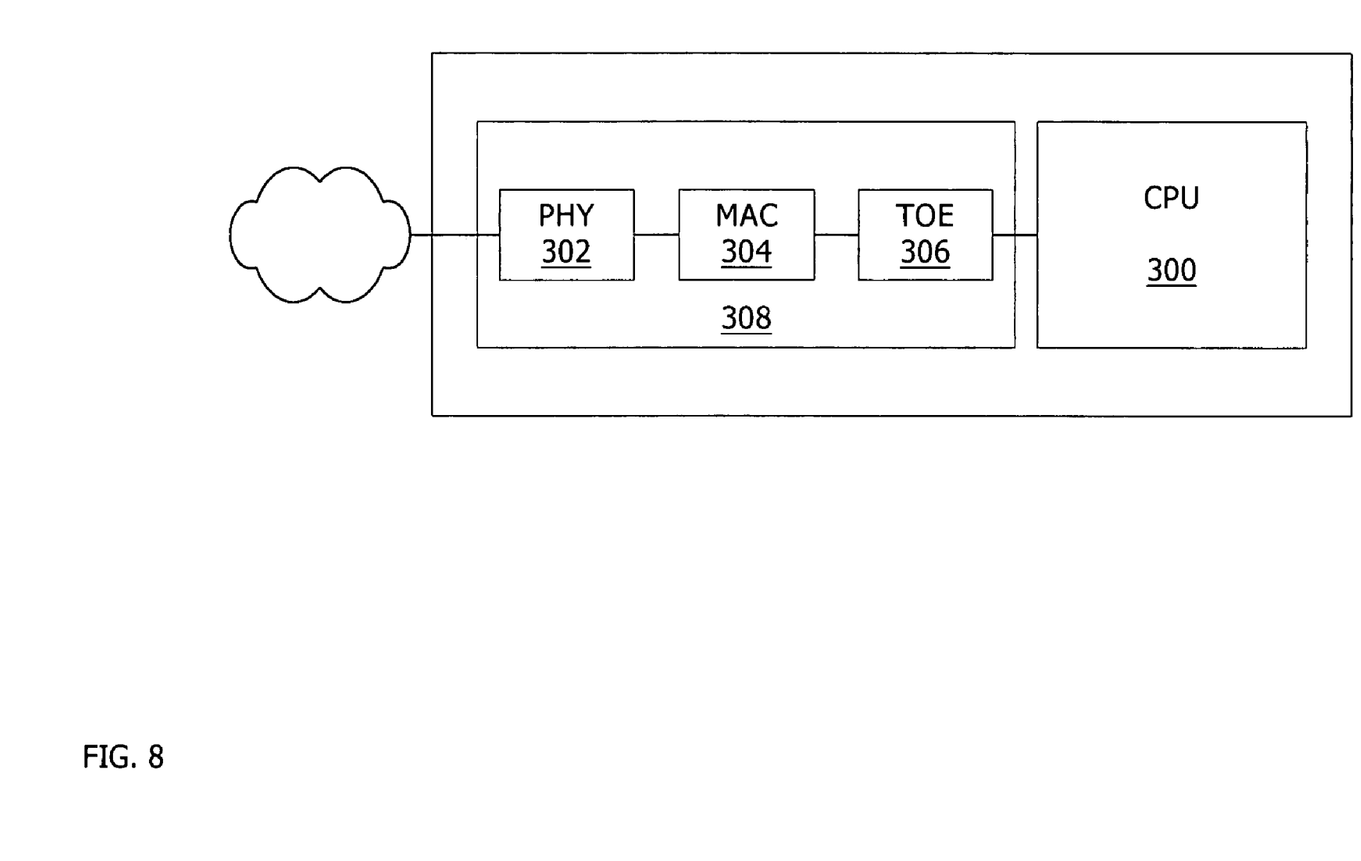
FIG. 8 is a diagram of a computing system including a Transmission Control Protocol (TCP) Offload Engine (TOE).

FIG. 8 depicts an example of a system including a TCP Offload Engine 306 that handles TCP operations on behalf of processor 300 (e.g., a server processor). As shown, the engine 306 receives packet data via a physical layer (PHY) component 302 (e.g., a wire, wireless, or optic PHY) and a layer 2 component (e.g., an Ethernet MAC or Synchronous Optical Network (SONET) framer). The PHY(s) 302, Layer 2 component(s) 304, and offload engine 306 may be combined on a network interface card. Alternately, the TOE may be included within a motherboard chipset.

The offload engine 306 may be implemented using a variety of components. For example, the engine 306 may include one or more network processors such as the IXP described above. Whether the offload engine uses the IXP, other network processor, or a design not featuring network processors (e.g., an Application Specific Integrated Circuit (ASIC) or other hardware, firmware, or software, implementing the incremental checksum update can potentially increase the overall throughput of the offload engine 306.

In addition to the TOE shown in FIG. 8, the techniques may be used in a wide variety of network devices (e.g., a router, switch, bridge, hub, traffic generator, and so forth).

The term packet was sometimes used in the above description to refer to a TCP segment. However, the term packet also encompasses a frame, fragment, Asynchronous Transfer Mode (ATM) cell, and so forth, depending on the network technology being used.

The term circuitry as used herein includes hardwired circuitry, digital circuitry, analog circuitry, programmable circuitry (e.g., a processor or engine), and so forth. The programmable circuitry may operate on computer programs such as programs coded using a high level procedural or object oriented programming language. However, the program(s) can be implemented in assembly or machine language if desired. The language may be compiled or interpreted. Additionally, these techniques may be used in a wide variety of networking environments.

Other embodiments are within the scope of the following claims.

What is claimed is:

1. A method of determining a checksum of at least a portion of a packet, the method comprising:
   accessing a checksum of the at least the portion of the packet;
   adjusting the checksum of the at least the portion of the packet based on values of a subset of the at least the portion of the packet before and after modification of the subset; and
   storing an identifier of the packet and a pointer to a set of data associated with the identifier, the set of data including the checksum of the at least the portion of the packet, wherein the set of data includes data identifying the location of a cached copy of the subset of the at least the portion of the packet.

2. The method of claim 1, wherein the storing the identifier comprises storing the identifier in a content addressable memory (CAM).

3. The method of claim 1, further comprising:
   receiving a request to access the subset of the at least the portion of the packet from an application;
   caching the subset;
   receiving a request to write data to the cached subset; and
   performing the adjusting.

4. The method of claim 3, wherein the application comprises an application to parse and modify data included in the packet payload.

5. The method of claim 1, wherein the adjusting comprises executing program instructions at an engine of network processor having multiple engines.

6. The method of claim 5, wherein the engines comprise engines individually providing multiple threads having associated program counters.

7. The method of claim. 1, wherein the packet comprises a Transmission Control Protocol (TCP) segment.

8. The method of claim 7, wherein the at least the portion of the packet comprises the TCP segment payload.

9. The method of claim 7, wherein the adjusting the checksum comprises:
   subtracting a checksum of the subset of the segment before the modification; and
   adding a checksum of the subset of the segment after the modification.

10. The method of claim 7, further comprising performing the adjusting of the checksum after each of a series of modifications of the segment.

11. A computer program product, disposed on a computer readable medium, to determine a checksum of at least a portion of a packet, the program including instructions for causing programmable circuitry to:
    access a checksum of the at least the portion of the packet;
    adjust the checksum of the at least the portion of the packet based on values of a subset of the at least the portion of the packet before and after modification of the subset; and
    store an identifier of the packet and a pointer to a set of data associated with the identifier, the set of data including the checksum of the at least the portion of the packet, wherein the set of data includes data identifying the location of a cached copy of the subset of the at least the portion of the packet.

12. The program product on a medium of claim 11, further comprising instructions for causing the programmable circuitry to:
    receive a request to access the subset of the at least the portion of the packet from an application;
    cache the subset;
    receive a request to write data to the cached subset; and
    perform the adjusting.

13. The program product on a medium of claim 11, wherein the instructions comprise instructions in an instruction set of an engine of network processor having multiple multi-threaded engines integrated on a single die.

14. The program product on a medium of claim 11, wherein the instructions to cause the programmable circuitry to store the identifier comprise instructions to cause the programmable circuitry to store the identifier in a content addressable memory (CAM).

15. The program product on a medium of claim 11, wherein the packet comprises a Transmission Control Protocol (TCP) segment.

16. The program product on a medium of claim 15, wherein the at least the portion of the packet comprises the TCP segment payload.

17. The program product on a medium of claim 15, wherein the instructions to cause the programmable circuitry to adjust the checksum comprise instructions to cause the programmable circuitry to:
    subtract the checksum of the subset of the segment before the modification; and
    add the checksum of the subset of the segment after the modification.

18. The program product on a medium of claim 15, further comprising instructions for causing the programmable circuitry to perform the adjusting of the checksum after each of a series of modifications of the segment payload.

19. A component, comprising:
    an input interface;
    an output interface;
    logic to
       access a checksum of at least a portion of a packet received via the input interface;
       adjust the checksum of the at least the portion of the packet based on values of a subset of the at least the portion of the packet before and after modification of the subset; and
       store an identifier of the packet and a pointer to a set of data associated with the identifier, the set of data including data identifying the checksum of the at least the portion of the packet, the set of data including data identifying the location of a cached cony of the subset of the at least the portion of the packet.

20. The component of claim 19, wherein the packet comprises a Transmission Control Protocol (TCP) segment.

21. The component of claim 19, wherein the logic further comprises logic to
    receive a request to access the subset of the at least the portion of the packet from an application;

cache the subset;
receive a request to write data to the cached subset; and
perform the adjusting.

22. A system, comprising:
at least one processor; and
at least one network interface operationally coupled to the processor, the network interface comprising:
at least one PHY (physical layer) component;
at least one framer; and
at least one Transmission Control Protocol (TCP) Offload Engine (TOE), the Offload Engine comprising circuitry to determine a checksum of at least a portion of a TCP segment, the circuitry to:
access a checksum of the at least the portion of the segment;
adjust the checksum of the at least the portion of the TCP segment based on values of a subset of the at least the portion of the TCP segment before and after modification of the subset; and
store an identifier of the TCP segment and a pointer to a set of data associated with the identifier, the set of data including data identifying the checksum of the at least the portion of the TCP segment, the set of data including data identifying the location of a cached copy of the subset of the at least the portion of the TCP segment.

23. The system of claim 22, wherein the framer comprises an Ethernet framer.

24. The system of claim 22, wherein the circuitry comprises an engine of network processor having multiple multi-threaded engines integrated on a single die.

* * * * *